(12) United States Patent
Kang et al.

(10) Patent No.: US 6,632,705 B1
(45) Date of Patent: Oct. 14, 2003

(54) MEMORY MODULES AND PACKAGES USING DIFFERENT ORIENTATIONS AND TERMINAL ASSIGNMENTS

(75) Inventors: Bok-moon Kang, Junglin (TW);
Byung-se So, Sungnam (KR);
Jung-joon Lee, Seoul (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 323 days.

(21) Appl. No.: 09/688,297

(22) Filed: Oct. 13, 2000

(30) Foreign Application Priority Data

Oct. 13, 1999 (KR) .............................. 99-44302

(51) Int. Cl.⁷ .............................................. H01L 21/44
(52) U.S. Cl. ..................... 438/107; 257/723; 257/724; 365/51; 365/63; 710/1
(58) Field of Search ....................... 438/107; 257/723, 257/724; 365/51, 63; 710/1

(56) References Cited

U.S. PATENT DOCUMENTS 5,860,080 A * 1/1999 James et al. .................. 711/4
5,941,447 A * 8/1999 Chu et al. ............... 228/180.21
5,996,880 A * 12/1999 Chu et al. ............... 228/180.21

* cited by examiner

*Primary Examiner*—Stephen D. Meier
*Assistant Examiner*—Jeff Vockrodt
(74) *Attorney, Agent, or Firm*—Harness, Dickey & Pierce, P.L.C.

(57) ABSTRACT

A memory module and a method of packaging memory devices are provided. The method prepares semiconductor packages of the memory devices, each of which has external pins that include data pins and command signal pins, and mounts the packages on a printed circuit board, on which a first bus, a second bus, and a third bus are formed. The data pins of odd-numbered packages and even-numbered packages connect to the first bus and the second bus, respectively. The control signal pins connect to the third bus. Each package can optionally include dummy pins, where the dummy pins of the even-numbered packages and the odd-numbered packages respectively connect to the first and second buses so that each of the first, second and third buses connects to the same number of external pins. The pin assignment of the even-numbered packages can be different from the pin assignment of the odd-numbered packages to facilitate connections of the buses.

14 Claims, 8 Drawing Sheets

MEMORY MODULES AND PACKAGES USING DIFFERENT ORIENTATIONS AND TERMINAL ASSIGNMENTS

BACKGROUND OF THE INVENTION

1. Field of the Invention

The present invention relates to memory modules and packaging of integrated memory circuits.

2. Description of the Related Art

Fast computer systems have needed memory modules and dynamic random access memories (DRAMs) having high bandwidths and short access times. To meet these needs, synchronous DRAM (SDRAM), double data rate SDRAM, and Rambus DRAM (RDD) have been developed. When using RDDs in a main memory, each RDD is generally mounted on a Rambus inline memory module (RiMM).

FIG. 1 shows the configuration of a typical RDD memory system, which includes multiple RiMMs connected to a controller. Each RiMM includes a printed circuit board SUB, on or through which multiple RDDs serially connect to each other. RDDs of each RiMM operate according to signals synchronized with a clock signal. In particular, each RDD of the main memory operates according to a packet of signals, which are sequentially received during a specific period, and each RDD receives and outputs data independently of the other RDDs.

FIG. 2 illustrates a RiMM such as used in the memory system of FIG. 1. The RiMM includes eight RDDs ID0 to ID7, each of which has sixteen data input/output (I/O) pins (DQ pins) DQA1 to DQA8 and DQB1 and DQB8. The bandwidth of the RiMM depends on the output speed and the number of DQ pins or terminals on each RDD. Each RDD ID0 to ID7 in FIG. 2 can be a 8M×16 RDD package. FIG. 3 is an expanded view of area (A) of FIG. 2 and illustrates how buses on the RiMM connect to the data and control pins of the separate RDD packages.

A pair of RDD packages, for example, RDD ID0 and RDD ID1 form a memory having a 16M×16 organization. However, a specific memory organization such as 16M×16 can be achieved in different manners, for example, using two (8M×16) RDD packages or two (16M×8) RDD packages. However, packages for memory chips having different data widths often have different sizes. For example, a packaged for ×8 RDD is typically smaller than a package for a ×16 RDD because the ×8 package has fewer data pins. Accordingly, methods, modules, and packages that use memory chips having narrower data widths to achieve a high data bandwidth facilitate reducing the size of memory components.

SUMMARY OF THE INVENTION

The present invention provides memory modules and methods of packaging memory devices. In accordance with an embodiment of the invention, a method includes: preparing semiconductor packages of the memory devices, each of which has external pins that include external data I/O pins and command signal pins; mounting the packages on a printed circuit board, on which a first bus, a second bus, and a third bus are formed; connecting the data I/O pins of odd-numbered packages to the first bus; connecting the data I/O pins of even-numbered packages to the second bus; and connecting the command signal pins of the packages to the third bus. The semiconductor packages can have orientations that alternate so that even-numbered packages have one orientation and odd-numbered packages have another orientation.

In accordance with another embodiment of the invention, a memory module includes: a printed circuit board on which a first bus, a second bus, and a third bus are formed; and semiconductor packages, each of which includes a memory device, data pins, and command signal pins. In odd-numbered packages, the data pins connect to the first bus, and in even-numbered packages, the data pins connect to the second bus. The command signal pins of the packages connect to the third bus. The even-numbered packages can have orientations or assignment of pins that differ from those of the odd-numbered packages.

BRIEF DESCRIPTION OF THE DRAWINGS

The features and advantages of the present invention will become more apparent by describing in detail specific embodiments thereof with reference to the attached drawings in which.

Use of the same reference symbols indicates identical or similar items.

DESCRIPTION OF THE PREFERRED EMBODIMENTS

Memory systems using Rambus DRAMs (RDDS) require a channel with an impedance that is lower than the impedance of channels for some other DRAMs and SDRAMs. For example, the channel impedance of an SDRAM memory system is typically between 50Ω and 80Ω, while the channel impedance of an RDD memory system must be approximately 28Ω. In addition, the channel impedance deviation of different channels on a RiMM must be within +/– 10% of 28Ω for accurate transmission of data. In the design of a typical RiMM, portions of the printed circuit board away from the RDDS, such as the tab (connecting area to external system) portion, are designed to have channel impedance of 28Ω +/– 10%. The portion of RiMM printed circuit board, on which RDDs will be mounted, is designed to have an impedance such that a combination with the impedance of the RDDs results in the impedance of 28Ω +/– 10%. Generally, the line impedance of a line (on the RiMM printed circuit board) on which no RDDs are mounted is $(L_L/C_L)^{1/2}$, and the line impedance of a line on which RDDs are mounted is approximately $(L_L/(C_L+C_i))^{1/2}$. Here, $L_L$ is the self inductance of the line, $C_L$ is the self capacitance of the line, and $C_i$ is the input capacitance of an RDD connected to the line. Accordingly, the impedance of a line on which RDDs are mounted depends on the input capacitance of the RDDs.

Figure 1:
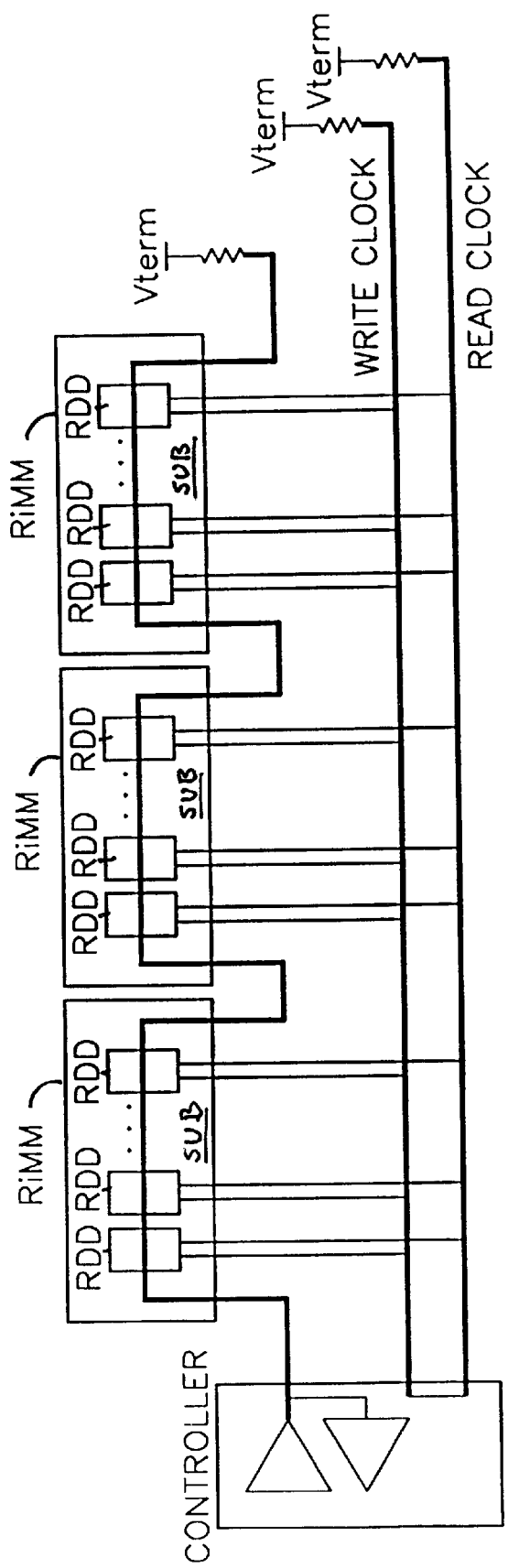
FIG. 1 is a schematic diagram of a conventional Rambus memory system.
Figure 2:
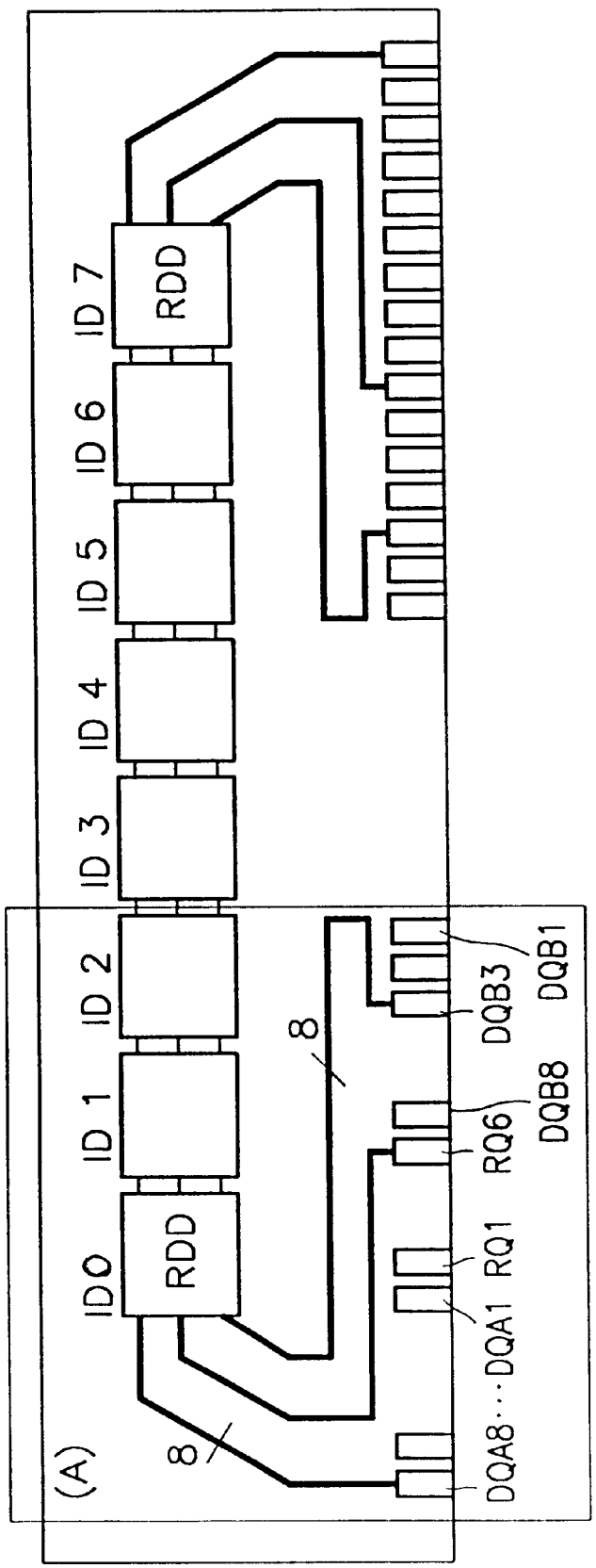
FIG. 2 illustrates a conventional Rambus inline memory module (RiMM)
Figure 3:
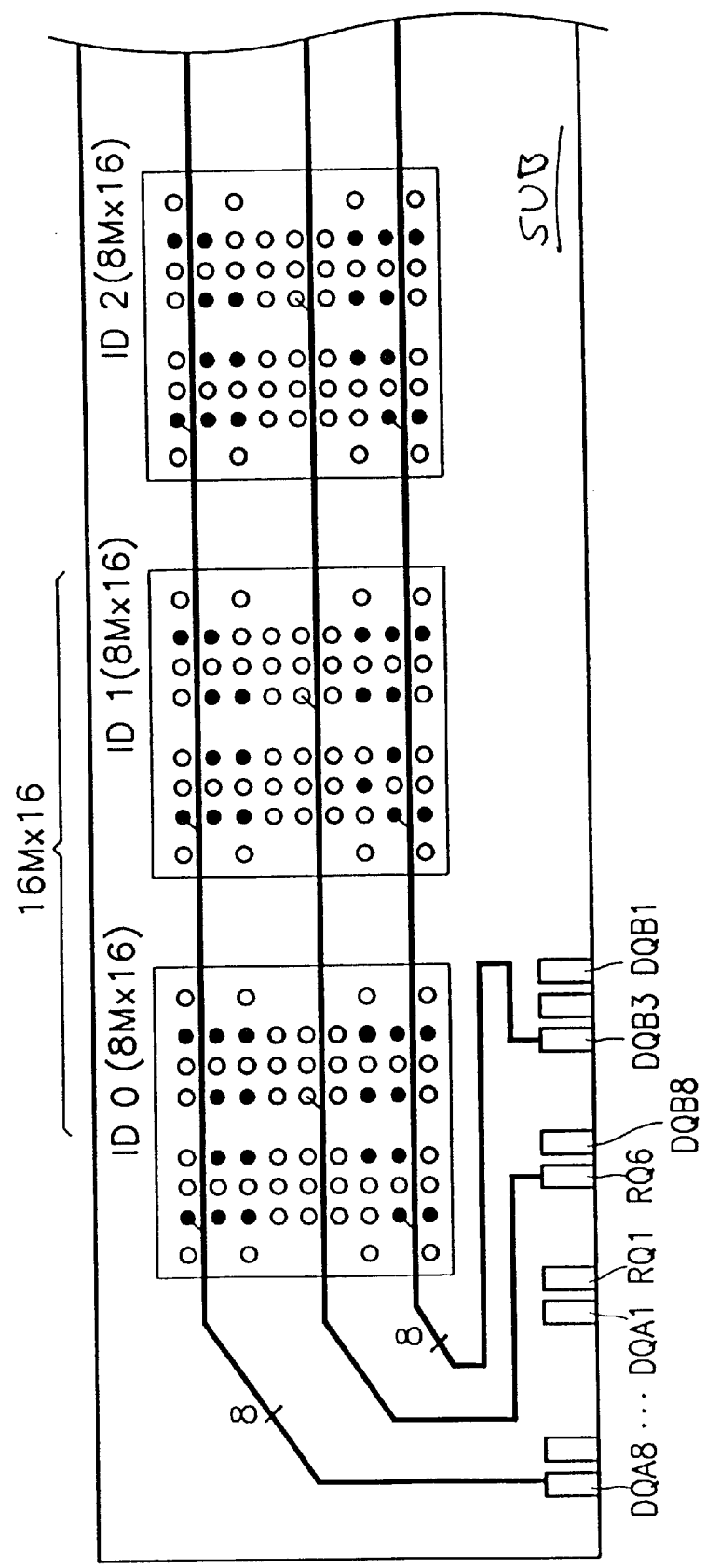
FIG. 3 is a magnified view of the portion (A) of FIG. 2.
Figure 4:
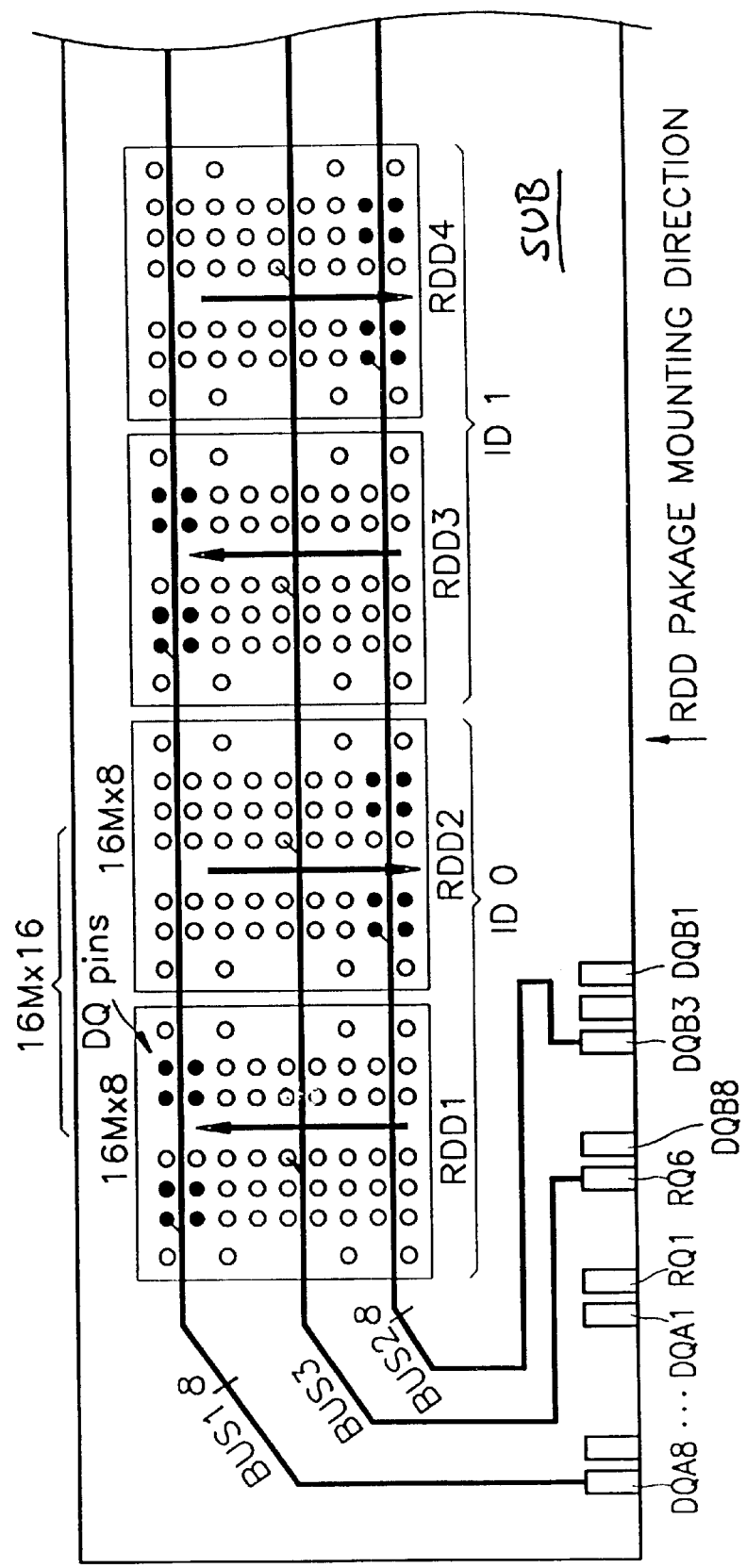
FIG. 4 is a partial view of a RiMM according to an embodiment of the present invention.

FIG. 4 illustrates a RiMM according to an embodiment of the present invention, in which pairs of (16M×8) RDDs are combined to function as (16M×16) RDDs. In FIGS. 4 to 9, RDDs are packaged in an area array package form, such as μ-BGA (Ball Grid Array), and white and dark circles are external pins of the RDD packages. Dark circles denote data pins for receiving and outputting a first or second group of data DQA or DQB, and white circles denote command pins for receiving commands and power pins for receiving a power supply voltage VDD or a ground voltage VSS. FIGS. 4 to 9 shows only one data pin or one command pin of each RDD as being connected to each bus. In an actual RiMM, each data pin and each required control pin of each RDD package connects to the appropriate data or command line of the RiMM.

Referring to FIG. 4, multiple RDD packages are arranged along the direction of buses BUS1, BUS2, and BUS3 on one side of a RiMM printed circuit board SUB. Odd-numbered RDD packages, such as RDD1 and RDD3, are mounted on printed circuit board SUB with one orientation, and even-numbered RDD packages, such as RDD2 and RDD4, are mounted on printed circuit board SUB with an orientation rotated by 180° with respect to the odd-numbered RDD packages. With these orientations, data pins of the odd-numbered RDDs are nearer the top of the RiMM, and data pins of the even-numbered RDDs are nearer the bottom of the RiMM. Two adjacent RDD packages, e.g., RDD1 and RDD2, are a memory pair, which forms a 16M×16 memory section.

Bus BUS1 transmits a first group of data signals DQAi (i is an integer, e.g., between 1 and 8) and connects to data pins of the odd-numbered RDD packages, such as RDD1 and RDD3. Bus BUS2 transmits a second group of data signals DQBi (i is an integer, e.g., between 1 and 8) and connects to the data pins of the even-numbered RDD packages, such as RDD2 and RDD4. The difference in orientations of RDDs allows buses BUS1 and BUS2 to connect to the RDDs without interfering with each other.

Bus BUS3 transmits a group of signals RQj (j being an integer, e.g., between 1 and 6), and commonly connects to all RDD packages. More generally, signals RQj include all signals except data signals, e.g., command signals and power supply voltage VDD.

In FIG. 4, each RDD package has (16M×8) organization, and a pair of a non-rotated package and a rotated package (RDD1, RDD2) or (RDD3, RDD4) operates as a 16M×16 RDD. As described above, bus BUS3 connects to all of the RDD packages, but buses BUS1 and BUS2 connect to alternate RDD packages. Thus, buses BUS1, BUS2, and BUS3 must be designed to have different impedances so that the impedance of the bus BUS3 with connected control terminals matches the impedance of bus BUS1 or BUS2 with the connected data terminals. The different orientations of RDD packages causes particular control pins to be in different relative location for even-numbered and odd-numbered packages, which can complicate the layout of bus BUS3. However, in accordance with a further aspect of the invention, the odd-numbered RDDs can have a pin assignment that differs from the pin assignment of even-numbered RDDs so that matching control terminals lie along the same line on the RiMM.

Figure 5:
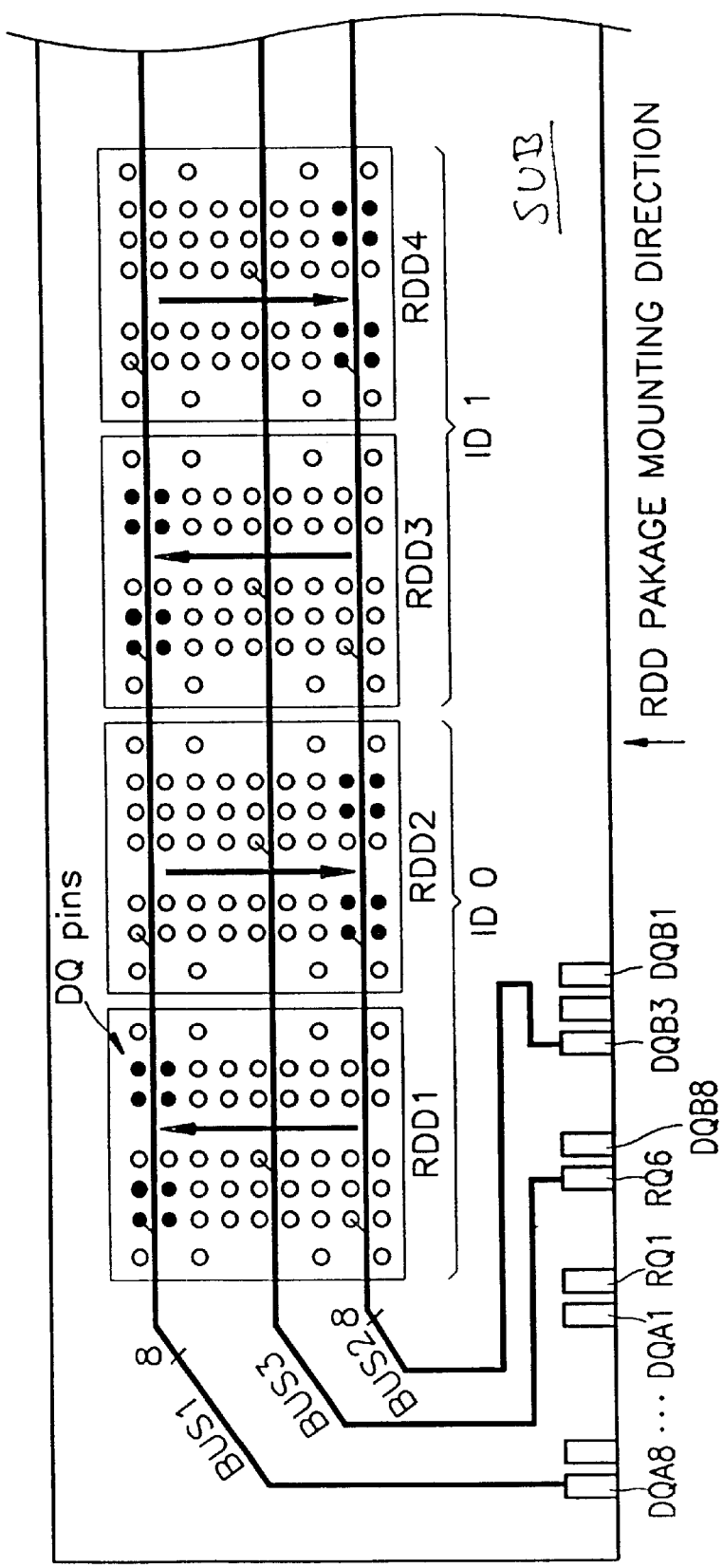
FIG. 5 is a partial view of a RiMM according to another embodiment of the present invention.

FIG. 5 illustrates a RiMM according to another embodiment of the present invention in which each of buses BUS1 and BUS2 connects to every RDD package. Odd-numbered RDD packages, such as RDD1 and RDD3, are mounted on printed circuit board SUB with one orientation, and even-numbered RDD packages, such as RDD2 and RDD4, are mounted on printed circuit board SUB with an orientation rotated by 180° with respect to the odd-numbered RDD packages. Bus BUS1 connects data pins of the odd-numbered packages RDD1 and RDD3 and to dummy pins of the even-numbered RDD packages RDD2 and RDD4. Similarly, bus BUS2 connects to the data pins of the even-numbered packages RDD2 and RDD4 and to dummy pins of the odd-numbered RDD packages RDD1 and RDD3. The dummy pins are not connected to active circuits inside the RDD packages, but each dummy pin provides an impedance approximately matching the impedance of a data pin or control pin. Thus, buses BUS1, BUS2, and BUS3 can be designed to have the same impedance and retain impedance matching when connected to the RDD packages.

A drawback of the RiMM of FIG. 5 is the complexity of routing of bus BUS3 to connect to the appropriate control pins. However, in an alternative embodiment of the inventions even and odd-numbered RDD have different pin assignments to simplify connection to bus BUS3.

Figure 6:
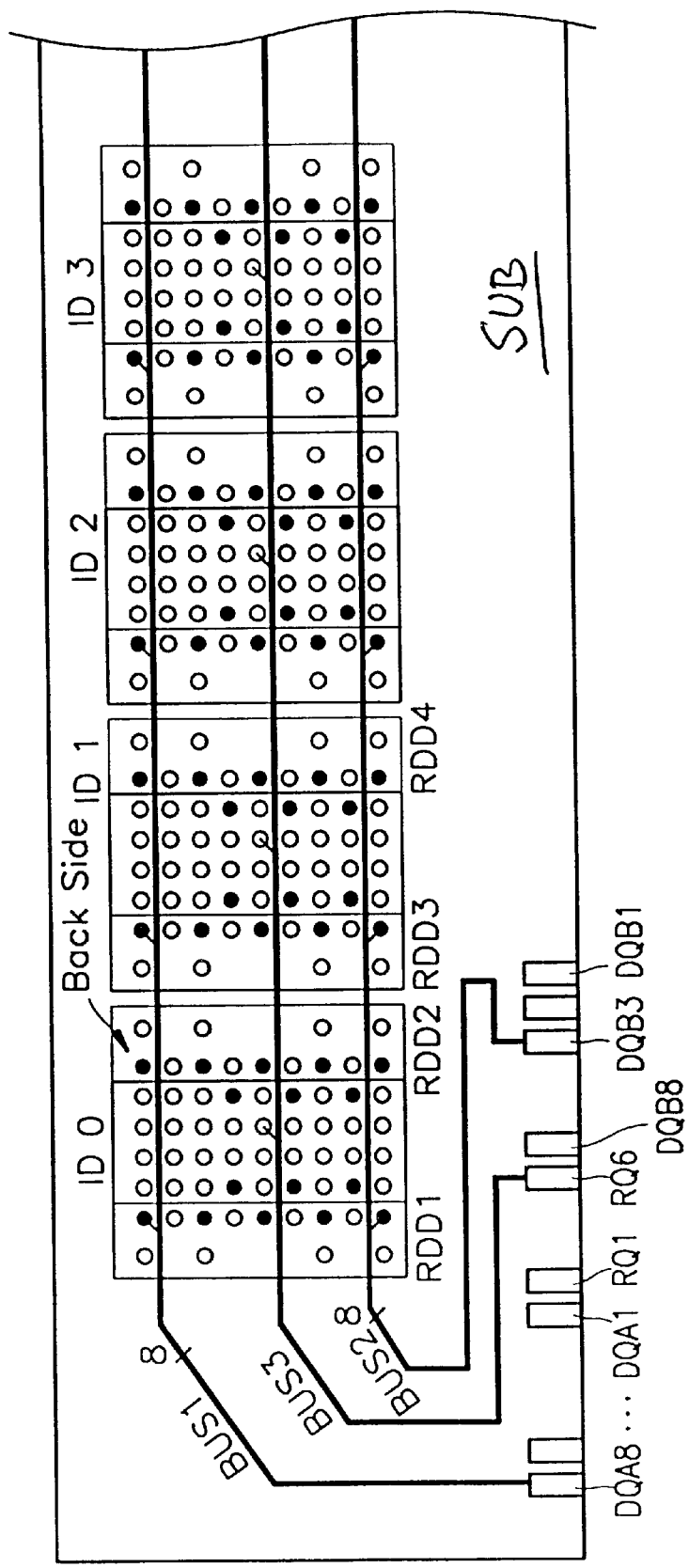
FIG. 6 is a partial view of a RiMM according to still another embodiment of the present invention.
Figure 7:
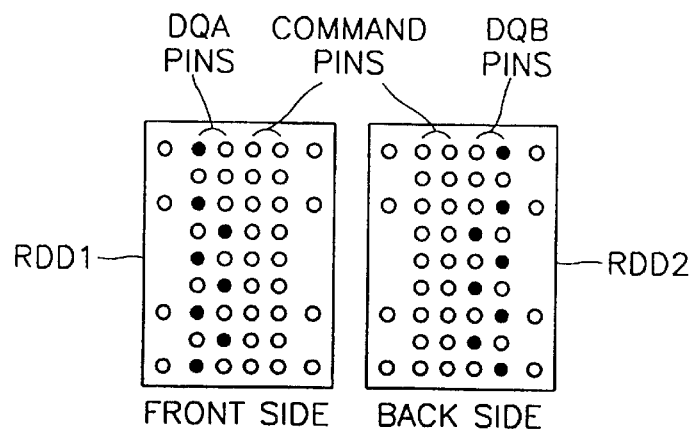
FIG. 7 shows pin configurations of RDDs used in the RiMM of FIG. 6.

FIGS. 6 and 7 illustrate a RiMM according to a still another embodiment of the present invention, in which two (16M×8) RDDs function as a (16M×16) RDD. In FIG. 6, odd-numbered RDD packages, such as RDD1 and RDD3, are mounted on the front side of printed circuit board SUB, and even-numbered RDD packages, such as RDD2 and RDD4, are mounted on the back side of printed circuit board SUB. For mounting on opposite sides of printed circuit board SUB, the even-numbered packages are flipped about an axis perpendicular to the direction of buses BUS1, BUS2, and BUS3 relative to the odd-numbered packages. A view of a transparent RiMM from above, as in FIG. 6, shows the pin configurations of the odd-numbered RDD packages and the even-numbered RDD packages. In the view of FIG. 6, each odd-numbered RDD package partially overlaps an even-numbered RDD package, and printed circuit board SUB is between them. FIG. 7 shows two of the RDDs (RDD1 and RDD2) in a view that is the same as FIG. 6 except that the RDD2 is shifted so that RDD1 and RDD2 no longer overlap. In this embodiment, DQ pins of the RDD packages are arranged along one side of the RDD packages, so that the DQ pins of the odd-numbered RDD packages do not overlap with the DQ pins of the even-numbered RDD packages.

Bus BUS1 that transmits signals DQA is formed on the front of printed circuit board SUB and connected to DQ pins of the odd-numbered RDD packages. Bus BUS2 that transmits signals DQB is formed on the back of printed circuit board SUB and connected to DQ pins of the package of the even-numbered RDD packages. Bus BUS3 that transmits a signals RQ is commonly connected to all RDD packages.

In FIG. 6, the pair of RDD packages RDD1 and RDD2 function as a (16M×16) RDD. The pair of RDD packages RDD3 and RDD4 also function as a (16M×16) RDD. In addition, since not all of buses BUS1, BUS2, and BUS3 connect to all RDD packages, buses BUS1, BUS2, and BUS3 are designed to have different impedances.

Figure 8:
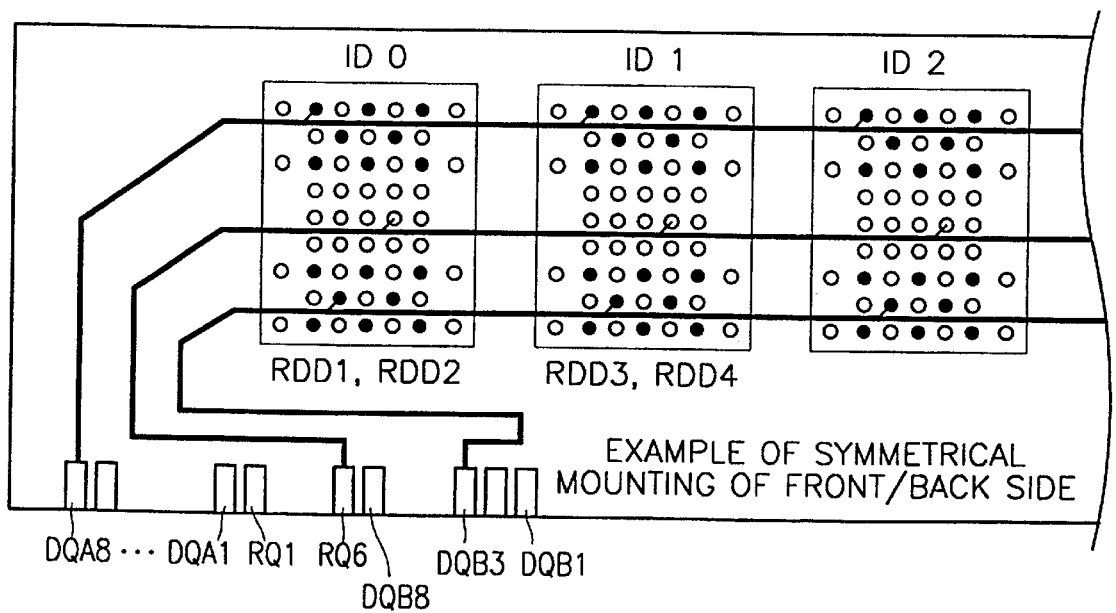
FIG. 8 is a partial view of a RiMM according to still another embodiment of the present invention.
Figure 9:
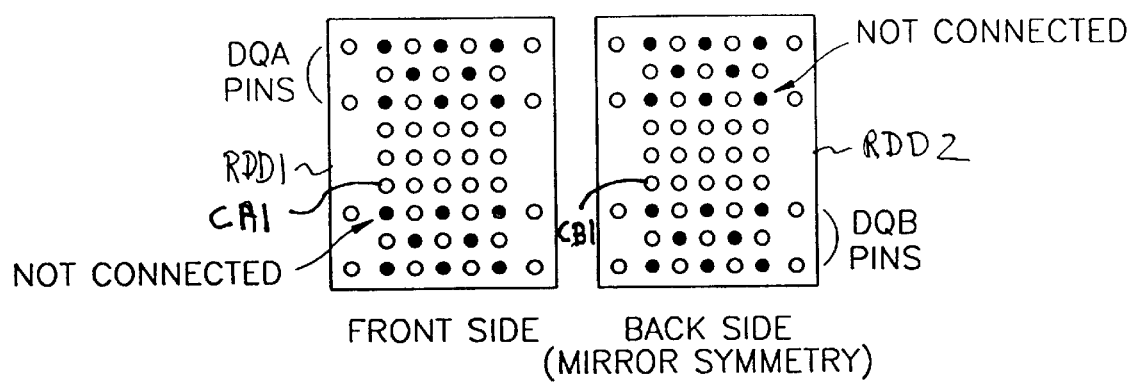
FIG. 9 shows pin configurations of RDDs in the RiMM of FIG. 8.

FIGS. 8 and 9 illustrate a RiMM according to a still another embodiment of the present invention, in which two (16M×8) RDDs can function as a (16M×16) RDD. In FIG. 8, odd-numbered RDD packages, such as RDD1 and RDD3, are mounted on the front of printed circuit board SUB, and even-numbered RDD packages, such as RDD2 and RDD4, are mounted on the back of printed circuit board SUB. In this case, for mounting on opposite sides of printed circuit board SUB, the even-numbered packages are flipped about an axis along the direction of buses BUS1, BUS2, and BUS3 relative to the odd-numbered packages. A view of a transparent RiMM from above, as in FIG. 8, shows the pin configurations of the odd-numbered RDD packages and the even-numbered RDD packages. In FIG. 8, each odd-numbered RDD package completely overlaps an even-numbered RDD packages. In particular, the DQ pins of the odd-numbered RDD packages are directly opposite the dummy or disconnected pins of the even-numbered RDD packages. FIG. 9 shows two of the RDDs (RDD1 and RDD2) in a view that is the same as FIG. 8 except that the RDD2 is shifted so that RDD1 and RDD2 no longer overlap.

Each line of buses BUS1 and BUS2 connects to a DQ or dummy pin of each RDD package. In particular, bus BUS1 connects to DQ pins of the odd-numbered packages RDD1 and RDD3 and to dummy pins of the even-numbered RDD packages RDD2 and RDD4. Similarly, bus BUS2 connects to dummy pins of the odd-numbered packages RDD1 and RDD3 and to DQ pins of the even-numbered RDD packages RDD2 and RDD4. The dummy pins are not connected to the active circuitry in the respective packages. The pin assignments of dummy and DQ pins in the odd-numbered RDD packages are the same as the pin assignments of dummy and DQ pins in the odd-numbered RDD packages. The dummy and DQ pin assignments appear to differ in FIG. 9 because FIG. 9 shows RDD package RDD2 is flipped relative to RDD package RDD1.

Each line bus BUS3 connects to a control pin on each of the RDD packages. However, to achieve a configuration where each control pin on an odd-numbered RDD package directly opposes a corresponding control pin on an even-numbered RDD package, the even-numbered RDD packages have a control pin assignment that differs from the pin assignment of the odd numbered packages. In particular, control pins CA1 and CB1 connect to the same line of bus BUS3 and to matching circuitry in respective RDD packages RDD1 and RDD2. However, control pin CA1 is near dummy pins of odd-numbered package RDD1, and control pin CB1 is near DQ pins of even-numbered package RDD2. More generally, the pin assignments of control pins in odd-numbered RDD packages are the mirror image of the pin assignments of control pins in even-numbered RDD packages.

The pair of RDD packages RDD1 and RDD2 function as a (16M×16) RDD. The pair of RDD packages RDD3 and RDD4 also function as a (16M×16) RDD. In addition, since buses BUS1, BUS2, and BUS3 connect to all RDD packages, buses BUS1, BUS2, and BUS3 are designed to have the same impedance.

Although the invention has been described with reference to particular embodiments, the description is only an example of the inventor's application and should not be taken as limiting. Various adaptations and combinations of features of the embodiments disclosed are within the scope of the invention as defined by the following claims.

What is claimed is:

1. A method of packaging a plurality of memory devices comprising:
    preparing a plurality of semiconductor packages, each of the packages including one of the memory devices, wherein each of the memory devices has a plurality of external pins including data pins and command signal pins;
    mounting the packages on a printed circuit board having a first bus, a second bus, and a third bus thereon, wherein the first, the second, and the third buses transmit a first group of signals, a second group of signals, and a third group of signals, respectively, wherein the packages are paired, so that a half of the packages are designated as odd-numbered packages and the other half of the packages are designated as even-numbered packages;
    connecting the data pins of the odd-numbered packages to the first bus;
    connecting the data pins of the even-numbered packages to the second bus; and
    connecting the command signal pins of the even-numbered and odd-numbered packages to the third bus.

2. The method of claim 1, wherein the even-numbered packages have an orientation rotated by 180° with respect to an orientation of the odd-numbered packages.

3. The method of claim 1, wherein the even-numbered packages are mounted on one side of the printed circuit board, and the odd-numbered packages are mounted on the other side of the printed circuit board.

4. A method of packaging a plurality of memory devices comprising:
    preparing a plurality of semiconductor packages, each of the packages including one of the memory devices, wherein each of the memory devices has a plurality of external pins including data pins, command signal pins, and dummy pins;
    mounting the packages on a printed circuit board having a first bus, a second bus, and a third bus thereon, wherein the first, the second, and the third buses transmit a first group of signals, a second group of signals, and a third group of signals, respectively, wherein the packages include a half of the packages that are odd-numbered packages and another half of the packages that are even-numbered packages;
    connecting the data pins of the odd-numbered packages and the dummy pins of the even-numbered packages to the first bus; connecting the dummy pins of the odd-numbered packages and the data pins of the even-numbered packages to the second bus; and
    connecting the command signal pins of the even-numbered packages and odd-numbered packages to the third bus,
    wherein the dummy pins are not connected to the memory devices inside the packages.

5. The method of claim 4, wherein the even-numbered packages have an orientation rotated by 180° with respect to an orientation of the odd-numbered packages.

6. The method of claim 4, wherein the even-numbered packages are mounted on one side of the printed circuit board, and the odd-numbered packages are mounted on the other side of the printed circuit board.

7. A memory module that includes a plurality of memory devices, comprising:
    a printed circuit board having a first bus, a second bus, and a third bus thereon; and
    a plurality of semiconductor packages including odd-numbered packages and even-numbered packages, each of the packages including one of the memory devices and having a plurality of external pins including data pins and command signal pins, wherein the data pins of the odd-numbered packages are connected to the first bus, the data pins of the even-numbered packages are connected to the second bus, and the command signal pins of the even-numbered and odd-numbered packages are connect to the third bus.

8. The memory module of claim 7, wherein the even-numbered packages have an orientation that is rotated by 180° with respect to an orientation of the odd-numbered packages.

9. The memory module of claim 7, wherein the even-numbered packages are mounted on one side of the printed circuit board, and the odd-numbered packages are mounted on the other side of the printed circuit board.

10. A memory module that includes a plurality of memory devices, comprising:
- a printed circuit board having a first bus, a second bus, and a third bus thereon; and
- a plurality of semiconductor packages including odd-numbered packages and even-numbered packages, each of the packages including one of the memory devices and having a plurality of external pins including data pins, command signal pins, and dummy pins, wherein the data pins of the odd-numbered packages and the dummy pins of the even-numbered packages are connected to the first bus, the dummy pins of the odd-numbered packages and the data pins of the even-numbered packages are connected to the second bus, and the command signal pins of the even-numbered and odd-numbered packages are connect to the third bus.

11. The memory module of claim 10, wherein the even-numbered packages have an orientation that is rotated by 180° with respect to an orientation of the odd-numbered packages.

12. The memory module of claim 10, wherein the even-numbered packages are mounted on one side of the printed circuit board, and the odd-numbered packages are mounted on the other side of the printed circuit board.

13. A method of packaging a plurality of memory devices, each of the memory devices having a plurality of external pins including data pins, command signal pins, and dummy pins; comprising:
- preparing a plurality of semiconductor packages, each of the packages including one of the memory devices;
- mounting the packages on a printed circuit board having a first bus, a second bus, and a third bus thereon, wherein one half of the packages are odd-numbered packages and another half of the packages are even-numbered packages, the even-numbered packages being mounted on one side of the printed circuit board, the odd-numbered packages being mounted on the other side of the printed circuit board so that data pins of the odd-numbered packages do not overlap with data pins of the even-numbered packages;
- connecting data pins of the odd-numbered packages and the dummy pins of the even-numbered packages to the first bus;
- connecting the dummy pins of the odd-numbered packages and the data pins of the even-numbered packages to the second bus; and
- connecting the command signal pins of the even-numbered packages and odd-numbered packages to the third bus.

14. A method of packaging a plurality of memory devices, each of the memory devices having a plurality of external pins including data pins, command signal pins, and dummy pins; comprising:
- preparing a plurality of semiconductor packages, each of the packages including one of the memory devices;
- mounting the packages on a printed circuit board having a first bus, a second bus, and a third bus thereon, wherein one half of the packages are odd-numbered packages and another half of the packages are even-numbered packages, the even-numbered packages and odd-numbered packages being mounted opposite sides of the printed circuit board so that pin assignments of command signal pins in the odd-numbered packages mirror pin assignments of command signal pins in the even-numbered packages;
- connecting data pins of the odd-numbered packages and the dummy pins of the even-numbered packages to the first bus;
- connecting the dummy pins of the odd-numbered packages and the data pins of the even-numbered packages to the second bus; and
- connecting the command signal pins of the even-numbered packages and odd-numbered packages to the third bus.

* * * * *